(12) United States Patent
Chen

(10) Patent No.: US 12,740,033 B2
(45) Date of Patent: Sep. 15, 2026

(54) FABRIC-OVER-FOAM (FOF) GASKET FOR COMPUTING STRUCTURE

(71) Applicant: Quanta Computer Inc., Taoyuan City (TW)

(72) Inventor: Ching-Jen Chen, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 220 days.

(21) Appl. No.: 18/786,418

(22) Filed: Jul. 26, 2024

(65) Prior Publication Data

US 2025/0338464 A1 Oct. 30, 2025

Related U.S. Application Data

(60) Provisional application No. 63/638,697, filed on Apr. 25, 2024.

(51) Int. Cl.
*H05K 9/00* (2006.01)
*G06F 1/18* (2026.01)

(52) U.S. Cl.
CPC ........... *H05K 9/0067* (2013.01); *G06F 1/182* (2013.01)

(58) Field of Classification Search
None
See application file for complete search history.

(56) References Cited

U.S. PATENT DOCUMENTS 7,763,810 B2 * 7/2010 van Haaster ......... H05K 9/0015 174/357
9,131,616 B2 * 9/2015 Wang .................. H05K 3/3431
9,980,417 B1 * 5/2018 Ji ........................ H05K 9/0015
2004/0191509 A1 * 9/2004 Kishioka .............. G06F 3/0412 428/354
2018/0329079 A1 * 11/2018 Lu ........................ H10F 39/195

* cited by examiner

*Primary Examiner* — James Wu
*Assistant Examiner* — Christopher L Augustin
(74) *Attorney, Agent, or Firm* — Nixon Peabody LLP

(57) ABSTRACT

A fabric-over-foam (FOF) gasket assembly includes a foam core having a shaped suited for sealing a gap in a structure of the computing device. The foam core has a base surface and a sealing surface. The FOF gasket assembly further includes an electrically conductive fabric wrapped around the foam core, and a conductive adhesive attached to the base surface. The conductive adhesive includes a release coat layer for attaching the conductive adhesive to the base surface of the foam core, a carrier layer attached to the release coat layer, and a release paper layer removably attached to the carrier layer. The carrier layer includes a polyethylene terephthalate (PET) layer forming a structural base of the threads, an inner layer of a copper material, and an outer layer of a nickel material.

20 Claims, 9 Drawing Sheets

FABRIC-OVER-FOAM (FOF) GASKET FOR COMPUTING STRUCTURE

CROSS-REFERENCE TO RELATED APPLICATIONS

This application claims priority to and the benefit of U.S. Provisional Patent Application Ser. No. 63/638,697, filed on Apr. 25, 2024, which is incorporated herein by reference in its entirety.

FIELD OF THE INVENTION

The present invention relates generally to computing systems, and more specifically, to a fabric-over foam (FOF) gasket for a structure of a computing device.

BACKGROUND OF THE INVENTION

Information technology systems, including computing devices (such as servers), typically have gaps in structural components that are bridged to prevent electrostatic discharge ("ESD"). For example, gaskets are usually provided in server cages to bridge a continuous path for electron flow, which tends to mitigate ESD risk.

However, enhanced electrical conductivity is achieved through high compression of the gaskets. The high compression reinforces a bond area between the gaskets and the server cages. Necessarily, the high compression requires a high level of physical force and effort in installation or maintenance of the servers.

Conversely, if the compression is reduced, then the electrical conductivity is also reduced. The reduction of the electrical conductivity subjects the servers to unsafe levels of ESD risk. Thus, problematically, present computing devices lack a gasket that achieves a suitable balance between high conductivity and low compression force.

The present disclosure provides a solution for this and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a fabric-over-foam (FOF) gasket assembly is configured for attachment to a computing device. The FOF gasket assembly includes a foam core having a shaped that is suited for sealing a gap in a structure of the computing device. The foam core has a base surface and a sealing surface. The FOF gasket assembly further includes an electrically conductive fabric that is wrapped around the foam core. The FOF gasket assembly also includes a conductive adhesive that is attached to the base surface and that includes a release coat layer, a carrier layer, and a release paper layer. The release coat layer is configured for attaching the conductive adhesive to the base surface of the foam core. The carrier layer is attached to the release coat layer. The carrier layer includes a polyethylene terephthalate (PET) layer forming a structural base of the threads, an inner layer of a copper material, and an outer layer of a nickel material. The release paper layer is removably attached to the carrier layer.

According to certain aspects of the present disclosure, in reference to the FOF gasket assembly disclosed above, the release coat layer has a first adhesive material that attaches the conductive adhesive to the base surface of the foam core.

According to certain aspects of the present disclosure, in reference to the FOF gasket assembly disclosed above, the first adhesive material is an acrylic glue.

According to certain aspects of the present disclosure, in reference to the FOF gasket assembly disclosed above, the carrier layer has a first surface and a second surface, the first surface being attached to the release coat layer.

According to certain aspects of the present disclosure, in reference to the FOF gasket assembly disclosed above, the carrier layer has a second adhesive material on the first surface and the second surface.

According to certain aspects of the present disclosure, in reference to the FOF gasket assembly disclosed above, the second adhesive material is an acrylic glue.

According to certain aspects of the present disclosure, in reference to the FOF gasket assembly disclosed above, the carrier layer has threads interweaved to form a grid with rows and columns.

According to certain aspects of the present disclosure, in reference to the FOF gasket assembly disclosed above, each one of the threads includes the PET layer, the inner layer, the outer layer, and the second adhesive material.

According to certain aspects of the present disclosure, in reference to the FOF gasket assembly disclosed above, the release paper layer is attached to the second surface of the carrier layer.

According to certain aspects of the present disclosure, in reference to the FOF gasket assembly disclosed above, the foam core has a semi-cylindrical shape or a D-shape.

According to certain aspects of the present disclosure, in reference to the FOF gasket assembly disclosed above, the foam core is configured for disposal in an E1. S cage.

According to certain aspects of the present disclosure, in reference to the FOF gasket assembly disclosed above, the conductive adhesive is three-dimensionally electrically conductive along X, Y, and Z directions.

According to certain aspects of the present disclosure, in reference to the FOF gasket assembly disclosed above, the foam core has a contact surface of about 4 millimeters×25 millimeters.

According to certain aspects of the present disclosure, in reference to the FOF gasket assembly disclosed above, the contact surface has a contact resistance of about 0.6 ohm.

According to other aspects of the present disclosure, a fabric-over-foam (FOF) gasket assembly is configured for attachment to an E1. S cage of a computing device. The FOF gasket assembly includes a foam core having a shaped suited for sealing a gap in the E1. S cage. The foam core has a base surface and a sealing surface. The FOF gasket assembly further includes an electrically conductive fabric wrapped around the foam core. The FOF gasket assembly also includes a conductive adhesive attached to the base surface.

The conductive adhesive includes a release coat layer having a first adhesive material that attaches the conductive adhesive to the base surface of the foam core. The conductive adhesive further includes a carrier layer having a first surface and a second surface. The first surface is attached to the release coat layer. The carrier layer has threads interweaved to form a grid with rows and columns. The threads include a polyethylene terephthalate (PET) layer forming a structural base of the threads, an inner layer of a copper material, an outer layer of a nickel material, and a second adhesive material on the first surface and the second surface. The conductive adhesive also includes a release paper layer attached to the second surface of the carrier layer. The release paper layer is removable from the carrier layer.

According to certain aspects of the present disclosure, in reference to the FOF gasket assembly disclosed above, one or more of the first adhesive material and the second adhesive material is an acrylic glue.

According to certain aspects of the present disclosure, in reference to the FOF gasket assembly disclosed above, the foam core has a semi-cylindrical shape or a D-shape.

According to certain aspects of the present disclosure, in reference to the FOF gasket assembly disclosed above, the conductive adhesive is three-dimensionally electrically conductive along X, Y, and Z directions.

According to certain aspects of the present disclosure, in reference to the FOF gasket assembly disclosed above, the foam core has a contact surface of about 4 millimeters×25 millimeters and a contact resistance of about 0.6 ohm.

According to yet other aspects of the present disclosure, a computing device includes an E1.S cage having a gap within its structure. The computing device further includes a fabric-over-foam (FOF) gasket assembly that is attached to the E1.S cage. The FOF gasket assembly includes a foam core positioned to seal the gap in the E1.S cage, an electrically conductive fabric, and a conductive adhesive attached to the foam core. The conductive adhesive includes a release coat layer, a carrier layer, and a release paper layer. The release coat layer has a first adhesive material for attaching the conductive adhesive to the foam core. The carrier layer has a first surface and a second surface. The first surface is attached to the release coat layer. The carrier layer has threads interweaved to form a grid with rows and columns. The threads include a polyethylene terephthalate (PET) layer forming a structural base of the threads, an inner layer of a copper material, an outer layer of a nickel material, and a second adhesive material on the first surface and the second surface. The release paper layer is attached to the second surface of the carrier layer. The release paper layer is removable from the carrier layer.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
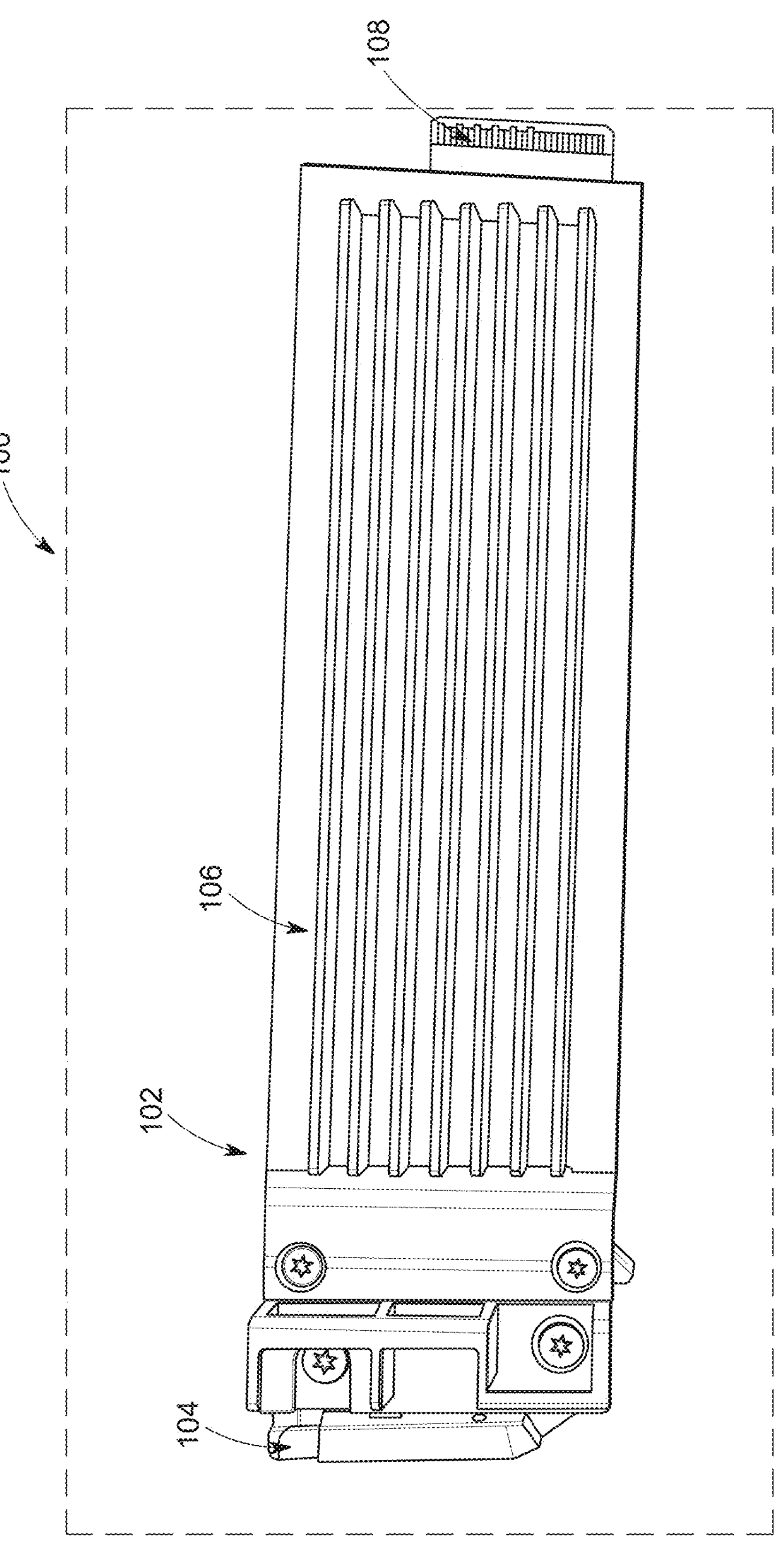
FIG. 1 is a side view representation of a removable component of a computing device, according to some aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a computing device 100 has a removable component 102, such as a server hard drive. The removable component 102, according to one example, has an E1.S form factor, and includes an E1.S latch 104 for removably mounting the E1.S removable component 102 within the computing device 100. The E1.S removable component 102 has an E1.S body 106 that extends between the E1.S latch 104 and a connector 108. The E1.S body 106 is electrically conductive.

Figure 2:
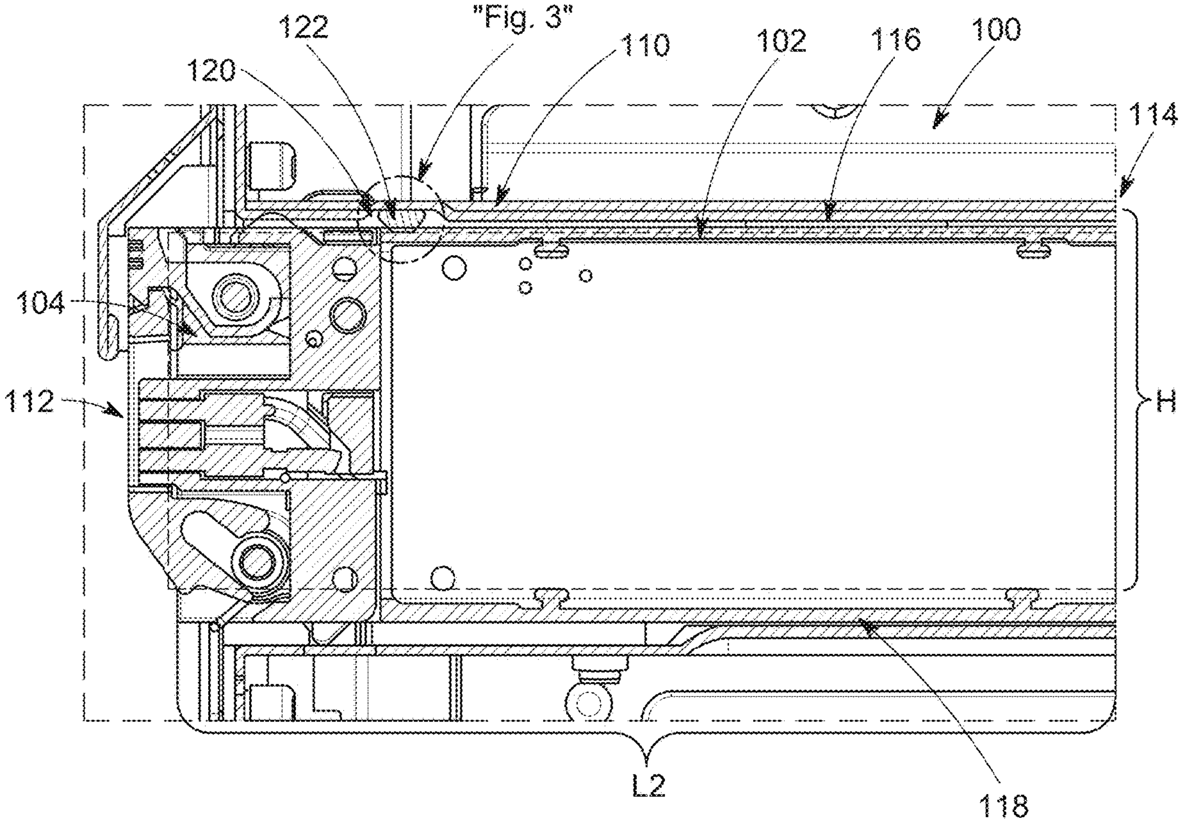
FIG. 2. is a cut-away representation of a cage of the computing device illustrated in FIG. 1.

Referring to FIG. 2, the computing device 100 further has a structural component 110 that is also electrically conductive. According to one example, the computing device 100 is a server system and the structural component 110 is an E1.S cage. The E1.S cage 110 is configured to receive within one or more E1.S removable components 102. Each E1.S removable component 102 is removably secured via a respective E1.S latch 104 to the E1.S cage 110.

The E1.S cage 110 extends along a length L1 between a front end 112 and a rear end 114. The E1.S cage 110 further extends along a height H between a top surface 116 of the E1.S cage 110 and a bottom surface 118 of the E1.S cage 110.

A gap 120 is formed between the E1.S cage 110 and the E1.S removable component 102, when the E1.S removable component 102 is inserted within the E1.S cage 110. To seal the gap 120, an FOF gasket assembly 122 is attached to the E1.S cage 110.

Figure 3:
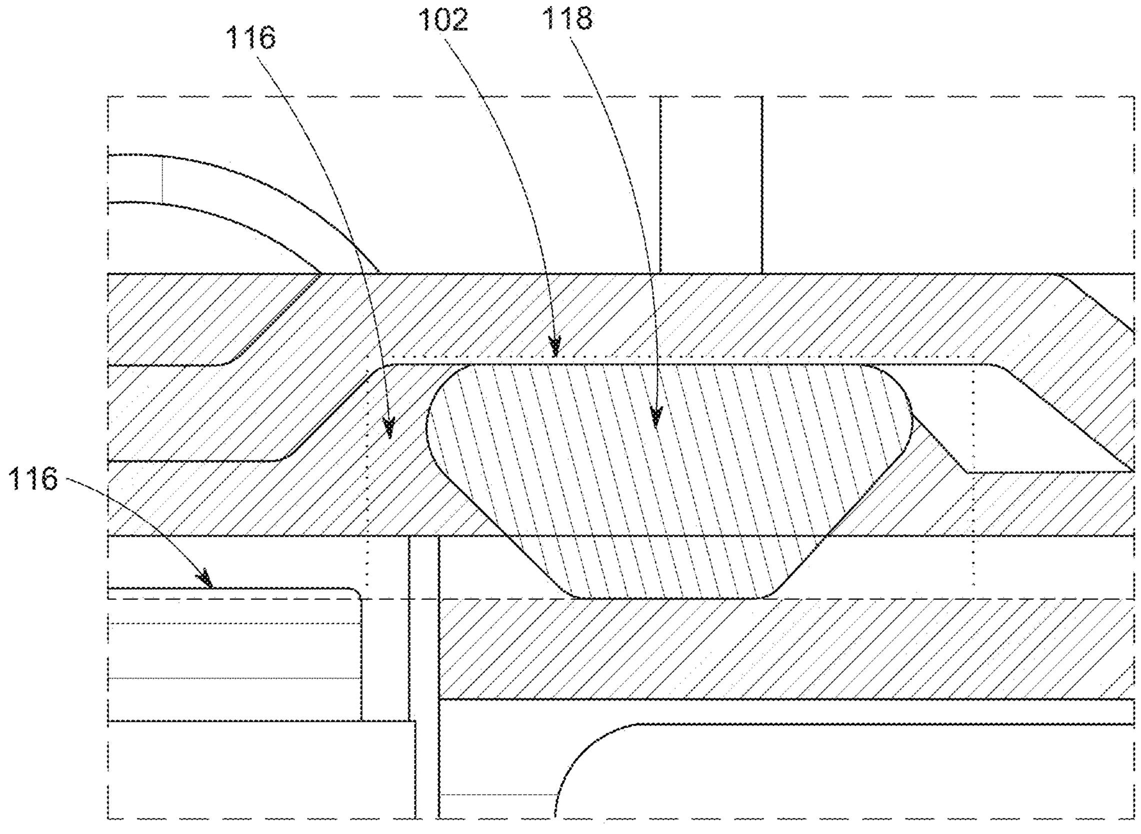
FIG. 3 is an enlarged view representation of a gap in the cage of FIG. 2.

Referring to FIG. 3, the FOF gasket assembly 122 (FIG. 2) is attached between the E1.S removable component 102 and the E1.S cage 110 (FIG. 2), in the gap 120 (FIG. 2). On one hand, as further disclosed below, the FOF gasket assembly 120 seals the gap 120 to minimize or completely eliminate ESD to a safe level. On another hand, the FOF gasket assembly 122 requires low compression that facilities effortless serviceability of the server system 100 (FIG. 2). In other words, insertion or removal of the E1.S removable component 102 requires a minimal, effortless physical force when staff performs a maintenance, installation, or other service to the computing device 100. Thus, the FOF gasket assembly 122 achieves an advantageous balance between: (a) high electrical conductivity for mitigating ESD risk; and (b) low compression force for effortless maintenance.

Figure 4:
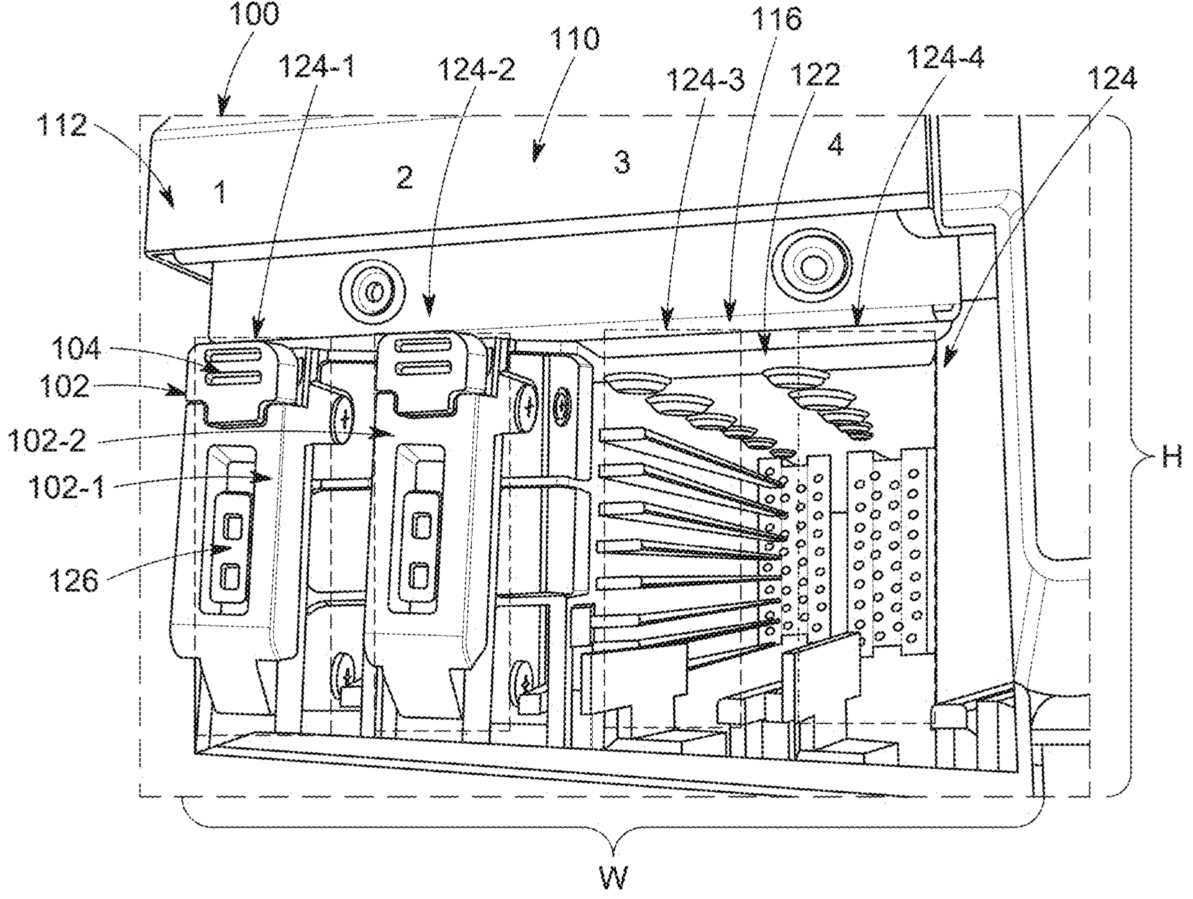
FIG. 4 is a front view representation of a portion of the cage illustrated in FIG. 1.

Referring to FIG. 4, the FOF gasket assembly 122 is mounted transversely along a width W1 of the E1.S cage 110, near the front end 112. Each E1.S removable component 102 is mounted within the E1.S cage 110 in a respective receiving slot 124. For example, the computing device 100 has two mounted E1.S removable components 102, and two open slots 124, which are ready to receive a respective E1.S removable component 102.

Thus, for ease of understanding, the computing device 100 has a total of four receiving slots 124: a first slot 124-1 (which has within a first E1.S removable component 102-1), a second slot 124-2 (which has within a second E1.S removable component 102-2), a third slot 124-3 (which is currently empty), and a fourth slot 124-4 (which is also currently empty). Each slot 124 is generally rectangular, extending along the height H and the width W1.

The FOF gasket assembly 122 is attached to the top surface 116 of the of the E1.S cage 110, extending at least in part across the four slots 124. In the present example, the FOF gasket assembly 122 extends across all four slots 124. However, in other examples, the FOF gasket assembly 122 extends across just some portion of one or more of the four slots 124.

Each E1.S removable component 102 has at least one light-emitting diode (LED) 126 mounted near a respective E1.S latch 104, along the front end 112. The LED 126 is indicative of a status of the respective E1.S removable component 102, such as representing normal operation or a faulty operation.

Figure 5:
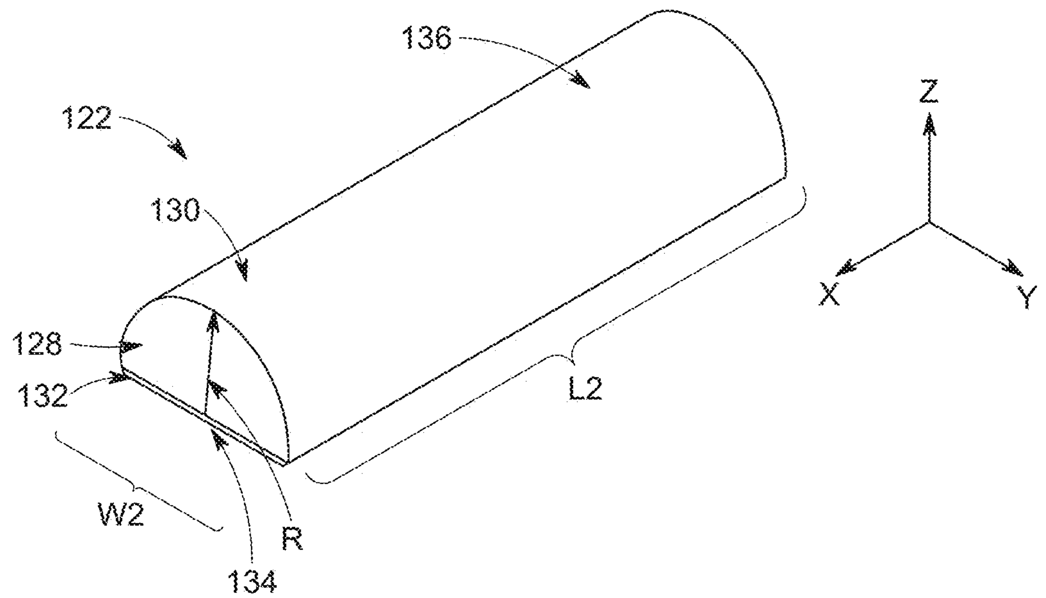
FIG. 5 is a perspective view representation of an FOF gasket assembly, according to some aspects of the present disclosure.

Referring to FIG. 5, the FOF gasket assembly 122 has a foam core 128, an electrically conductive fabric 130 (more clearly illustrated in FIG. 9), and a conductive adhesive 132. According to one example, the foam core 128 has a semi-cylindrical shape or a D-shape. For example, the foam core 128 has a shape that is generally defined by a radius R and a length L2.

The shape of the foam core 128 is generally suited for sealing the gap 120 (FIG. 2) of the computing device 100 (FIG. 2). The foam core 128 has a base surface 134 on which the electrically conductive fabric 130 is attached (as shown more clearly in FIG. 9). The foam core 128 further has a sealing surface 136 that seals the gap 120 and which generally bridges contact between the E1.S cage 110 and the E1.S removable component 102 (as shown more clearly in FIG. 4).

The conductive adhesive 132 is three-dimensionally electrically conductive along X, Y, and Z directions. In other words, the conductive adhesive 132 facilitates electrical conductivity, for minimizing or eliminating ESD risk to a safe level, along each of an X-axis, an Y-axis, and a Z-axis. For reference, the length L2 of the foam core 128 is along (or parallel to) the X-axis and a W2 of the foam core 128 is along (or parallel to) the Y-axis.

The base surface 134 of the foam core 128 is a contact surface that extends generally along the width W2 and the length L2. According to one example, the contact surface 134 is generally about 4 millimeters (mm) wide by about 25 mm long. According to another example, the contact surface 134 has a contact resistance of about 0.6 ohm.

Figure 6:
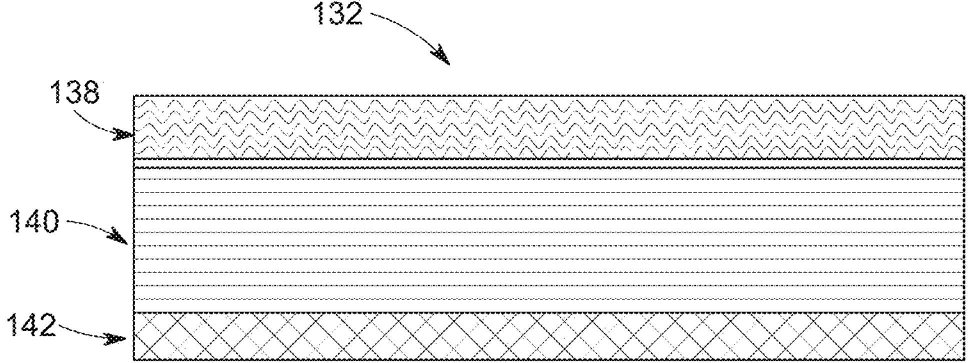
FIG. 6 is a side view representation of a conductive adhesive, according to some aspects of the present disclosure.

Referring to FIG. 6, the conductive adhesive 132 has a release coat layer 138, a carrier layer 140, and a release paper layer 142. The carrier layer 140 is attached to the release coat layer 138. The release paper layer 142 is removably attached to the carrier layer 140. Thus, the carrier layer is a middle layer, between the release coat layer 138 along one surface and the release paper layer 142 along another, opposite surface.

Figure 7:
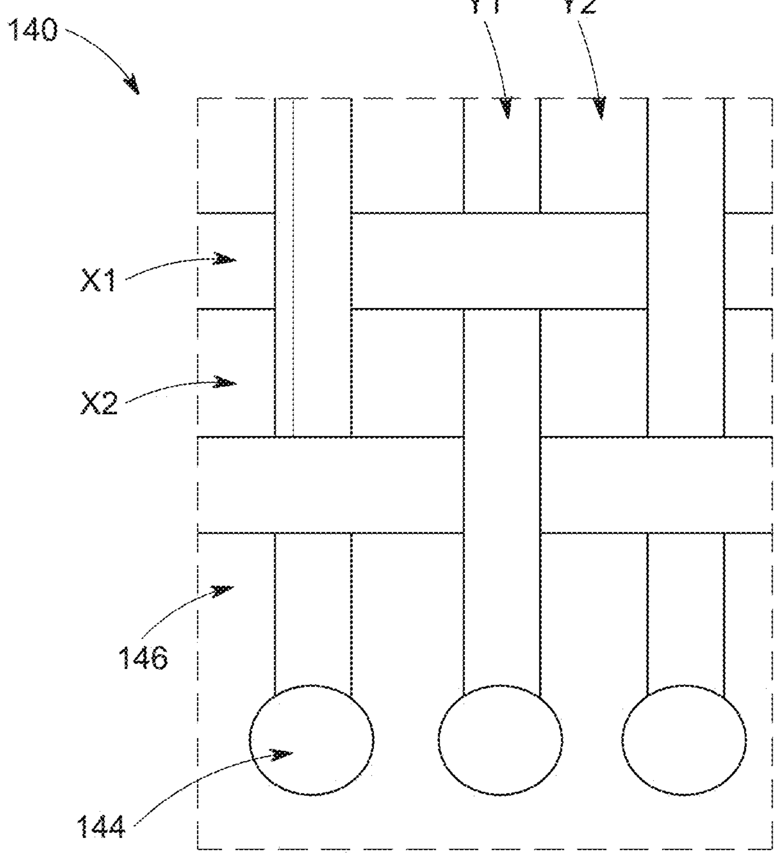
FIG. 7 is a top view representation of a carrier layer, according to some aspects of the present disclosure.

Referring to FIG. 7, the carrier layer 140 has threads 144 that are interweaved to form a grid 146. The grid 146 is defined by rows X1 and columns Y1 of the threads 144, which are separated from each with respective rows X2 and columns Y2 of empty space. According to one example, the rows X1 and columns Y1 are uniformly spaced across the grid 146. In the illustrated example, the rows X1 are generally horizontal and the columns Y1 are generally vertical. However, in other embodiments, the rows X1 and the columns Y1 can be oriented in other directions.

Figure 8:
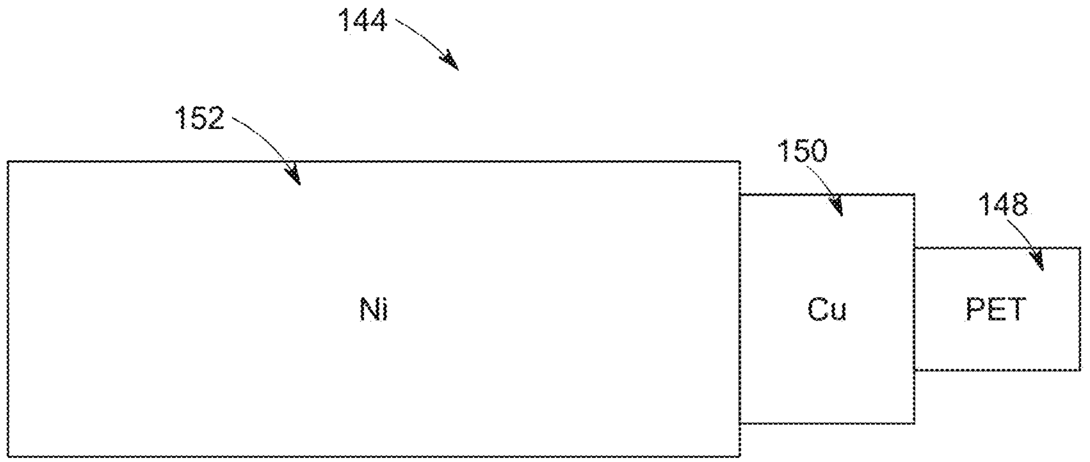
FIG. 8 is a diagrammatic representation of a thread of the carrier layer of FIG. 6, according to some aspects of the present disclosure.

Referring to FIG. 8, each thread 144 includes a polyethylene terephthalate (PET) layer 148 that forms a structural base of the threads. Each thread 144 further includes an inner layer 150 of a copper material, and an outer layer 152 of a nickel material.

Figure 9:
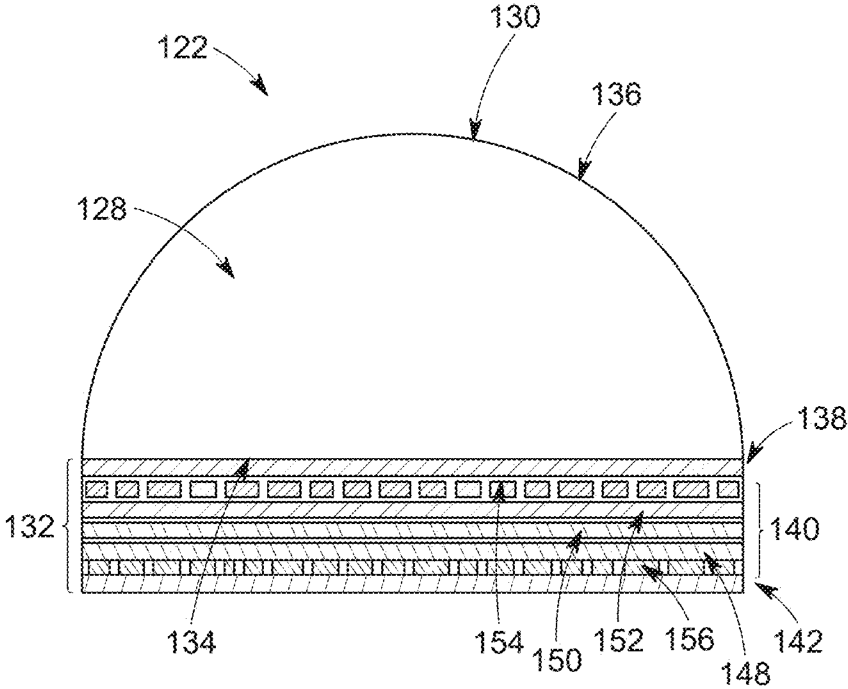
FIG. 9 is a side view representation of the FOF gasket assembly of FIG. 5.

Referring to FIG. 9, the electrically conductive fabric 130 of the FOF gasket assembly 122 is wrapped around the foam core 128. According to one example, the electrically conductive fabric 130 is wrapped fully around the foam core 128 to cover both the base surface 134 and the sealing surface 136. According to other examples, the electrically conductive fabric 130 is wrapped partially around the foam core 128 to cover at least one portion of at least one of the base surface 134 and the sealing surface 136.

The conductive adhesive 132 is attached to the base surface 134 of the foam core 128. The attachment of the conductive adhesive 132 to the base surface 134 is either an indirect attachment, via the electrically conductive fabric 130, or a direct attachment to the foam core 128.

The conductive adhesive 132 is attached to the base surface 134 with an adhesive material, such as acrylic glue. More specifically, the release coat layer 138 has a first adhesive material that attaches the conductive adhesive 132 to the base surface 134 of the foam core 128 (or, alternatively, to the electrically conductive fabric 130 if it is interposed between the foam core 128 and the conductive adhesive 132).

The three layers of the carrier layer 140 are arranged with the outer layer 152 closest to the base surface 134. The inner layer 150 is sandwiched between the outer layer 152 and the PET layer 148. The outer layer 152 is positioned adjacent to the release paper layer 142.

The carrier layer 140 has a first surface 154 and a second surface 156. The first surface 154 is attached to the release coat layer 138. The second surface 154 is attached to the release paper layer 142. The first surface 154 is an external surface of the outer layer 152. The second surface 156 is an external surface of the PET layer 148. The term "external" is used here relative to the carrier layer 140.

The carrier layer 140 has a second adhesive material on the first surface 154 and the second surface 156. According to one example, the second material is an acrylic glue. Optionally, the second adhesive material is generally imbibed with the grid 146 (FIG. 7), in one or more (e.g., all) of the threads 144 (FIG. 7).

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A fabric-over-foam gasket assembly for attachment to a computing device, the FOF gasket assembly comprising:
- a foam core having a shape suited for sealing a gap in a structure of the computing device, the foam core having a base surface and a sealing surface;
- an electrically conductive fabric wrapped around the foam core; and
- a conductive adhesive attached to the base surface, the conductive adhesive including:
- a release coat layer for attaching the conductive adhesive to the base surface of the foam core, a carrier layer attached to the release coat layer, the carrier layer including:
  - a polyethylene terephthalate (PET) layer forming a structural base of threads, an inner layer of a copper material, and an outer layer of a nickel material; and
  - a release paper layer removably attached to the carrier layer.

2. The FOF gasket assembly of claim 1, wherein the release coat layer has a first adhesive material that attaches the conductive adhesive to the base surface of the foam core.

3. The FOF gasket assembly of claim 2, wherein the first adhesive material is an acrylic glue.

4. The FOF gasket assembly of claim 1, wherein the carrier layer has a first surface and a second surface, the first surface being attached to the release coat layer.

5. The FOF gasket assembly of claim 4, wherein the carrier layer has a second adhesive material on the first surface and the second surface.

6. The FOF gasket assembly of claim 5, wherein the second adhesive material is an acrylic glue.

7. The FOF gasket assembly of claim 1, wherein the threads are interweaved to form a grid with rows and columns.

8. The FOF gasket assembly of claim 7, wherein each one of the threads includes the PET layer, the inner layer, the outer layer, and the second adhesive material.

9. The FOF gasket assembly of claim 1, wherein the release paper layer is attached to the second surface of the carrier layer.

10. The FOF gasket assembly of claim 1, wherein the foam core has a semi-cylindrical shape or a D-shape.

11. The FOF gasket assembly of claim 1, wherein the foam core is configured for disposal in an E1.S cage.

12. The FOF gasket assembly of claim 1, wherein the conductive adhesive is three-dimensionally electrically conductive along X, Y, and Z directions.

13. The FOF gasket assembly of claim 1, wherein the foam core has a contact surface of about 4 millimeters×25 millimeters.

14. The FOF gasket assembly of claim 13, wherein the contact surface has a contact resistance of about 0.6 ohm.

15. A fabric-over-foam (FOF) gasket assembly for attachment to an E1.S cage of a computing device, the FOF gasket assembly comprising:
- a foam core having a shape suited for sealing a gap in the E1.S cage, the foam core having a base surface and a sealing surface;
- an electrically conductive fabric wrapped around the foam core; and
- a conductive adhesive attached to the base surface, the conductive adhesive including:
  - a release coat layer having a first adhesive material that attaches the conductive adhesive to the base surface of the foam core,
  - a carrier layer having a first surface and a second surface, the first surface being attached to the release coat layer, the carrier layer having threads interweaved to form a grid with rows and columns, the threads including:
    - a polyethylene terephthalate (PET) layer forming a structural base of the threads,
    - an inner layer of a copper material,
    - an outer layer of a nickel material, and
    - a second adhesive material on the first surface and the second surface; and
  - a release paper layer attached to the second surface of the carrier layer, the release paper layer being removable from the carrier layer.

16. The FOF gasket assembly of claim 15, wherein one or more of the first adhesive material and the second adhesive material is an acrylic glue.

17. The FOF gasket assembly of claim 15, wherein the foam core has a semi-cylindrical shape or a D-shape.

18. The FOF gasket assembly of claim 15, wherein the conductive adhesive is three-dimensionally electrically conductive along X, Y, and Z directions.

19. The FOF gasket assembly of claim 15, wherein the foam core has a contact surface of about 4 millimeters×25 millimeters and a contact resistance of about 0.6 ohm.

20. A computing device comprising:

an E1.S cage having a gap within its structure; and a fabric-over-foam (FOF) gasket assembly attached to the E1.S cage and including:

a foam core positioned to seal the gap in the E1.S cage;

an electrically conductive fabric; and a conductive adhesive attached to the foam core and including:

a release coat layer with a first adhesive material for attaching the conductive adhesive to the foam core, a carrier layer having a first surface and a second surface, the first surface being attached to the release coat layer, the carrier layer having threads interweaved to form a grid with rows and columns, the threads including:

a polyethylene terephthalate (PET) layer forming a structural base of the threads, an inner layer of a copper material, an outer layer of a nickel material, and a second adhesive material on the first surface and the second surface; and a release paper layer attached to the second surface of the carrier layer, the release paper layer being removable from the carrier layer.

* * * * *